(12) United States Patent
Antolik

(10) Patent No.: US 6,936,135 B2
(45) Date of Patent: Aug. 30, 2005

(54) TWIST-N-LOCK WAFER AREA PRESSURE RING AND ASSEMBLY FOR REDUCING PARTICULATE CONTAMINANT IN A PLASMA PROCESSING CHAMBER

(75) Inventor: Jerrel K. Antolik, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 209 days.

(21) Appl. No.: 10/418,249

(22) Filed: Apr. 16, 2003

(65) Prior Publication Data

US 2003/0196756 A1 Oct. 23, 2003

Related U.S. Application Data

(60) Provisional application No. 60/373,491, filed on Apr. 17, 2002.

(51) Int. Cl.[7] .......................... H01L 21/00; C23C 16/00
(52) U.S. Cl. ............ 156/915; 156/345.53; 156/345.51; 118/715; 118/723 R; 118/500; 204/192.1; 204/298.1; 216/67; 438/710; 315/111.71; 427/534; 427/569
(58) Field of Search ........................... 156/915, 345.51, 156/345.53; 118/715–733, 500; 204/192.1, 298.1; 216/67; 438/710; 427/534, 569; 315/111.71; 206/821; 74/142

(56) References Cited

U.S. PATENT DOCUMENTS

| | | | | |
|---|---|---|---|---|
| 5,534,751 A | * | 7/1996 | Lenz et al. ............. | 315/111.71 |
| 5,998,932 A | * | 12/1999 | Lenz ....................... | 315/111.21 |
| 6,019,060 A | * | 2/2000 | Lenz ....................... | 118/723 R |
| 6,178,919 B1 | * | 1/2001 | Li et al. ................... | 118/723 E |
| 6,350,317 B1 | * | 2/2002 | Hao et al. ................ | 118/71 |
| 6,416,084 B1 | * | 7/2002 | Mantyla ................... | 285/56 |
| 6,492,774 B1 | * | 12/2002 | Han et al. ................ | 315/111.21 |
| 6,527,911 B1 | * | 3/2003 | Yen et al. ................ | 156/345.43 |
| 6,602,381 B1 | * | 8/2003 | Lenz ....................... | 156/345.1 |
| 6,744,212 B2 | * | 6/2004 | Fischer et al. ........... | 315/11.21 |
| 2002/0121500 A1 | * | 9/2002 | Annapragada et al. ........ | 216/67 |
| 2003/0029567 A1 | * | 2/2003 | Dhindsa et al. ........ | 156/345.47 |

* cited by examiner

Primary Examiner—P. Hassanzadeh
Assistant Examiner—Ram N Kackar
(74) Attorney, Agent, or Firm—IP Strategy Group, P.C.

(57) ABSTRACT

A confinement ring coupling arrangement for coupling, in a plasma processing chamber, a confinement ring to a plunger. The plunger is configured to move the confinement ring to deploy and stow the confinement ring to facilitate processing of a substrate within the plasma processing chamber. The confinement ring coupling arrangement includes a hanger adapter having a locking head, the hanger adapter being configured to be coupled with the plunger. The confinement ring coupling arrangement further includes a hanging bore disposed in the confinement ring and configured to receive the locking head and to secure the locking head within the hanging bore during stowing and deployment of the confinement ring, wherein a diameter of the locking head is sufficiently smaller than a cross-section dimension of the hanging bore to prevent a sidewall of the locking head from scraping against a sidewall of the hanging bore during the stowing and deployment of the confinement ring.

17 Claims, 16 Drawing Sheets

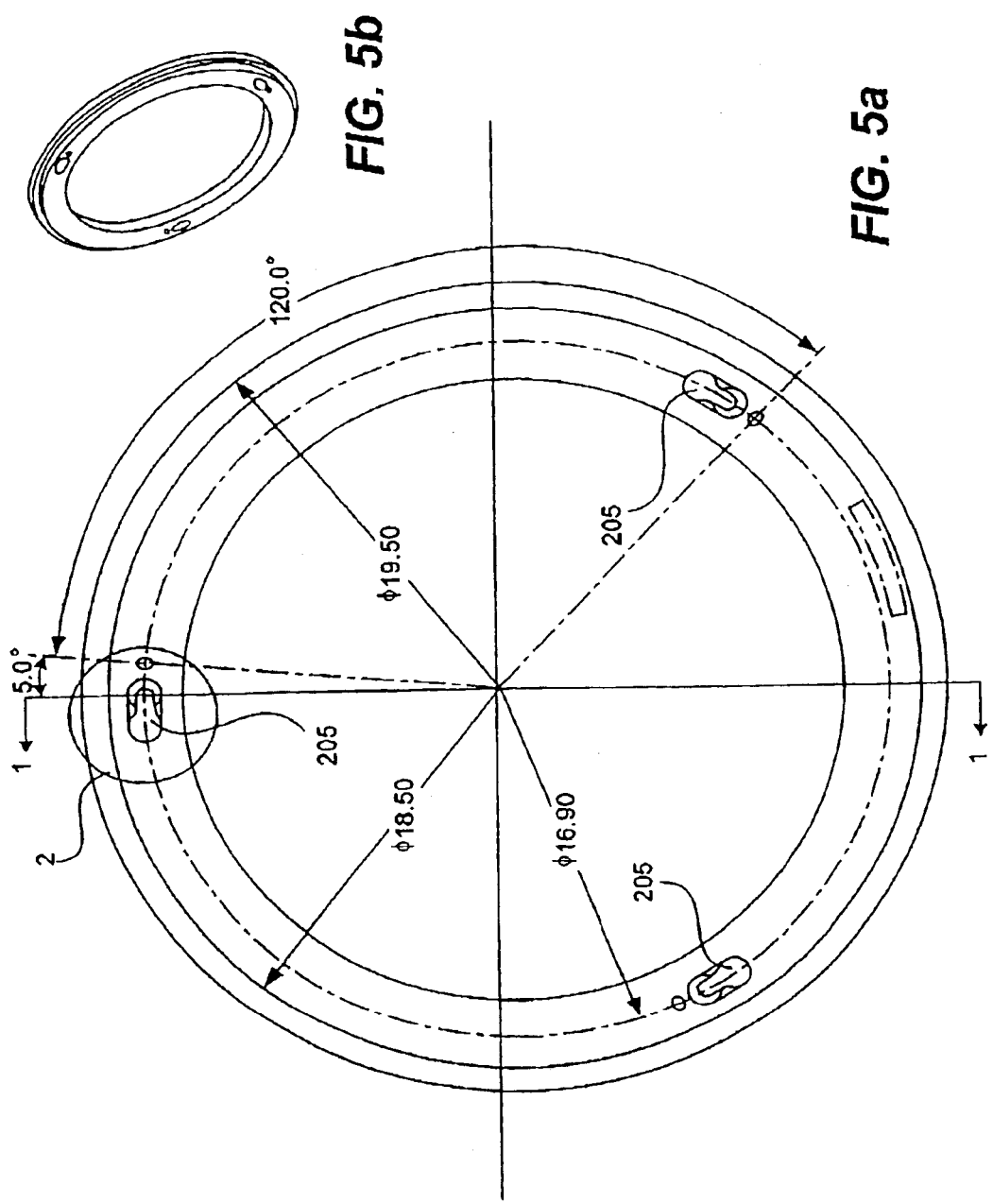

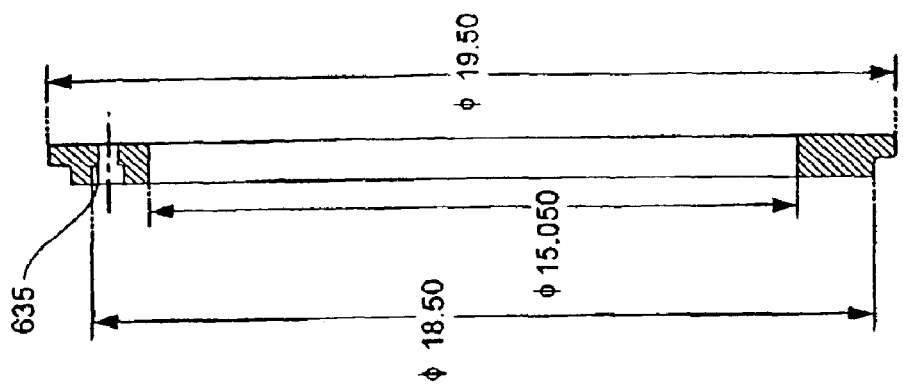
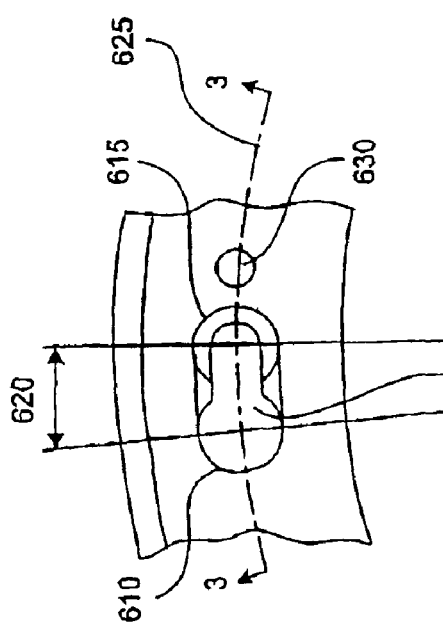
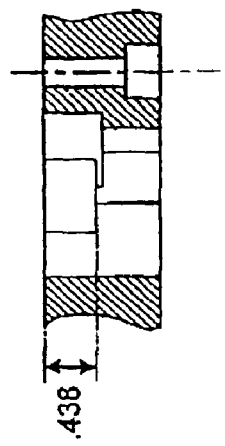
FIG. 6c
FIG. 6a
FIG. 6b

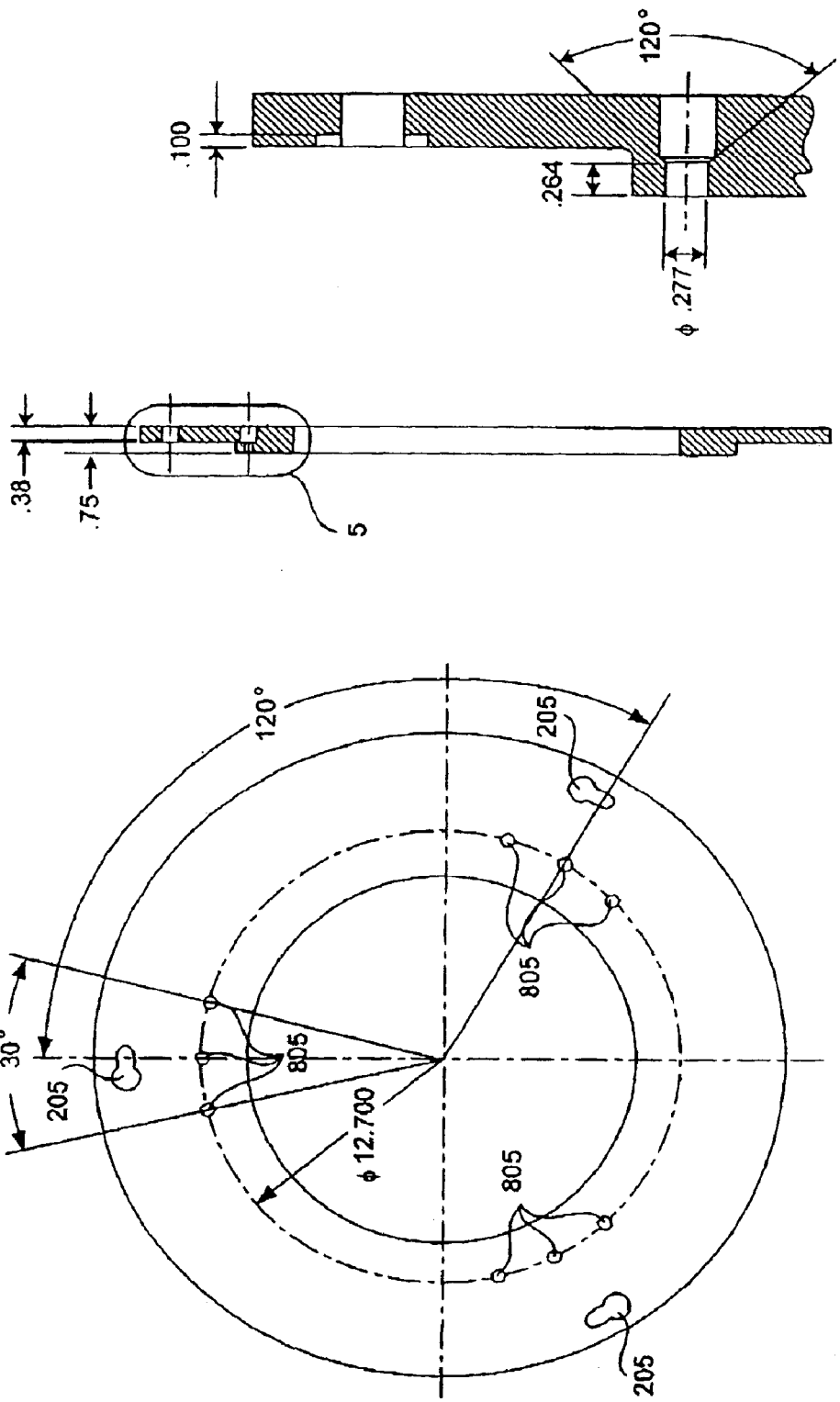

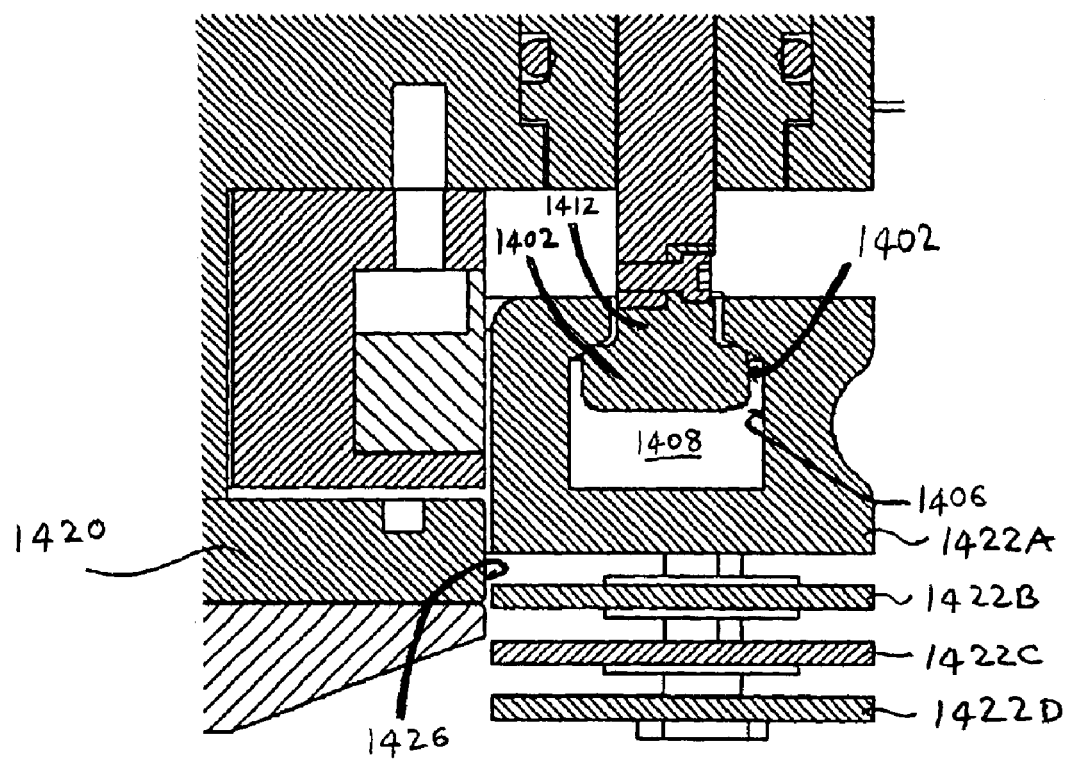
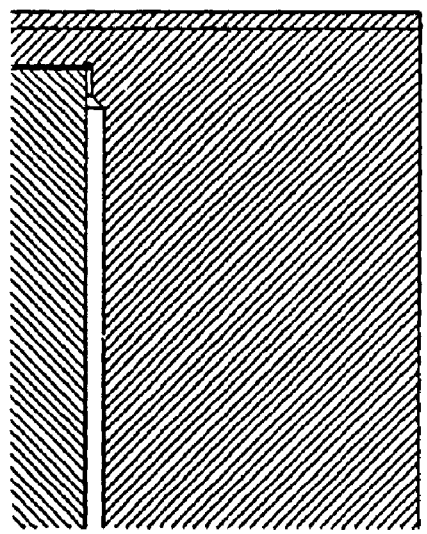
FIG. 14

TWIST-N-LOCK WAFER AREA PRESSURE RING AND ASSEMBLY FOR REDUCING PARTICULATE CONTAMINANT IN A PLASMA PROCESSING CHAMBER

CROSS REFERENCE TO RELATED APPLICATION

The present invention claims priority from a commonly assigned U.S. Provisional Application Ser. No. 60/373,491, filed Apr. 17, 2002 entitled "WAP Ring Assembly Hanger Apparatus" and a commonly assigned U.S. patent application Ser. No. 09/916,784, filed Jul. 27, 2001 entitled "Twist-N-Lock Wafer Area Pressure Ring and Assembly", and a commonly assigned U.S. Provisional Application Ser. No. 60/281,049, filed Apr. 2, 2001 entitled "Twist-N-Lock Wafer Area Pressure Ring and Assembly" all of which are by inventor Jerrel K. Antolik and are incorporated by reference herein.

BACKGROUND OF THE INVENTION

The present invention relates to methods and apparatus used to control the pressure around and above a substrate. More particularly, the present invention relates to improved wafer area pressure control rings.

In the fabrication of semiconductor-based devices (e.g., integrated circuits) layers of material may alternately be deposited onto and etched from a substrate (e.g., the semiconductor wafer). As is well known in the art, the etching of the deposited layers may be accomplished by a variety of techniques, including plasma enhanced etching. In plasma-enhanced etching, the actual etching of the substrate takes place inside a plasma processing chamber. During etching, a plasma is formed from a suitable etchant source gas to etch areas of the substrate that are unprotected by the mask, leaving behind the desired pattern.

Among different types of plasma etching systems, those utilizing confinement rings have proven to be highly suitable for efficient production and/or for forming the ever shrinking features on the substrate. An example of such a system may be found in the commonly assigned U.S. Pat. No. 5,534,751, which is incorporated by reference herein. Although the use of confinement rings results in a significant improvement in the performance of plasma processing systems, current implementations can be improved. In particular, it is realized that improvements can be made in the way in which confinement rings are maintenanced and replaced. More particularly, significant improvements can be made in the way in which these rings are attached within the chamber.

To facilitate discussion, FIG. 1 depicts a current wafer area pressure (WAP) ring hanger assembly. The prior art design as shown by FIG. 1, required a technician to the hold the WAP ring assembly 100 in place, while another technician fastened screw 105 and clamp 130 to suspend the ring from the plunger shaft 115 of the upper chamber assembly. Although not shown in FIG. 1, but known to those of ordinary skill in the art, typically the pressure ring assembly 100 is attached at three points, each spaced 120 degrees from one another, further complicating assembly.

The ring assembly 100 is typically a composite of 4 rings which (the top ring, ring no. 4, 125 being the thickest) according to desired pressure requirements can be raised or lowered with the aid of the stepped hanger 110. The operation of removing and reinstalling the WAP ring assembly has been identified as an ergonomic safety issue. Additionally, the use of tools and fasteners in conjunction with the installation and removal of the WAP rings increases the opportunity for ring damage, dropping of parts (e.g., screws and washers) into the pump, as well as an increased time component for replacement. It should be noted that the stepped hanger 110 is one continuous piece, i.e., the stepped portion is attached directly to the plunger shaft 115.

The combined hanger/stepped hanger design of the prior art is also unwieldy because while the technician is attaching the hanger to the plunger shaft, the quartz rings are loosely floating and must be securely held while the technician secures the screw 105 to the plunger shaft 115. Accordingly, it is desirable to simplify the removal and installation of these rings.

SUMMARY OF THE INVENTION

These and other features of the present invention will be described in more detail below in the detailed description of the invention and in conjunction with the following figures.

The invention relates, in one embodiment, to a confinement ring coupling arrangement for coupling, in a plasma processing chamber, a confinement ring to a plunger. The plunger is configured to move the confinement ring to deploy and stow the confinement ring to facilitate processing of a substrate within the plasma processing chamber. The confinement ring coupling arrangement includes a hanger adapter having a locking head, the hanger adapter being configured to be coupled with the plunger. The confinement ring coupling arrangement further includes a hanging bore disposed in the confinement ring and configured to receive the locking head and to secure the locking head within the hanging bore during stowing and deployment of the confinement ring, wherein a diameter of the locking head is sufficiently smaller than a cross-section dimension of the hanging bore to prevent a sidewall of the locking head from scraping against a sidewall of the hanging bore during the stowing and deployment of the confinement ring.

In another embodiment, the invention relates to a confinement ring coupling arrangement for coupling, in a plasma processing chamber, a confinement ring to a plurality of plungers. The plurality of plungers are configured to move the confinement ring to deploy and stow the confinement ring to facilitate processing of a substrate within the plasma processing chamber. The confinement ring coupling arrangement includes a plurality of hanger adapters, each of the plurality of hanger adapters having a locking head, the each of the plurality of hanger adapter being configured to be coupled with the a respective one of the plurality of plungers. The confinement ring coupling arrangement further includes a plurality of hanging bores disposed in the confinement ring, each of the plurality of hanging bores being configured to receive one of a plurality of locking heads of the plurality of hanger adapters and to secure the one of the plurality of locking heads within the each of the plurality of hanging bores during stowing and deployment of the confinement ring, wherein a diameter of the each of the plurality of locking heads is sufficiently smaller than a cross-section dimension of a respective hanging bore of the plurality of hanging bores within which the each of the plurality of locking heads is disposed to prevent a sidewall of the respective hanging bore from scraping against a sidewall of the each of the plurality of locking heads during the stowing and deployment of the confinement ring.

In yet another embodiment, the invention relates to a confinement ring coupling arrangement for coupling, in a plasma processing chamber, a confinement ring to a plunger. The plunger is configured to move the confinement ring to deploy and stow the confinement ring to facilitate processing of a substrate within the plasma processing chamber. The confinement ring coupling arrangement includes a hanger adapter having a locking head, the hanger adapter being configured to be coupled with the plunger. The confinement ring coupling arrangement further includes a hanging bore disposed in the confinement ring and configured to receive the locking head and to secure the locking head within the hanging bore during stowing and deployment of the confinement ring, wherein the hanging bore has a sloped ceiling, the locking head further has a radiused shoulder configured to slidably contact the sloped ceiling during the stowing of the confinement ring to automatically center the locking head with respect to the hanging bore during the stowing of the confinement ring.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5a is a bottom view of a 300 mm Twist-N-Lock WAP ring, with a bottom perspective given in FIG. 5b.

FIG. 6a is an expanded schematic of detail 2 of FIG. 5 showing the hanging bore.

FIG. 6b is a cut-out view of the hanging bore taken through line 3—3 of FIG. 6a.

FIG. 6c is a cross sectional view of the 300 mm Twist-N-Lock WAP ring taken through line 1—1 of FIG. 5.

FIG. 9a is a top view of a 200 mm Twist-N-Lock WAP ring.

FIG. 9b is a cross sectional view of the 200 mm Twist-N-Lock WAP ring taken through line 4—4 of FIG. 8.

FIG. 9c is a magnified schematic of detail 5 identified in FIG. 9b.

FIG. 14 shows, in accordance with one embodiment of the present invention, a cross-section view of one implementation of the Twist-N-Lock assembly having a particulate contaminant-reducing feature in the deployed position.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. The features and advantages of the present invention may be better understood with reference to the drawings and discussions that follow.

The present invention will now be described in detail with reference to a few preferred embodiments thereof as illustrated in the accompanying drawings. In the following descriptions, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
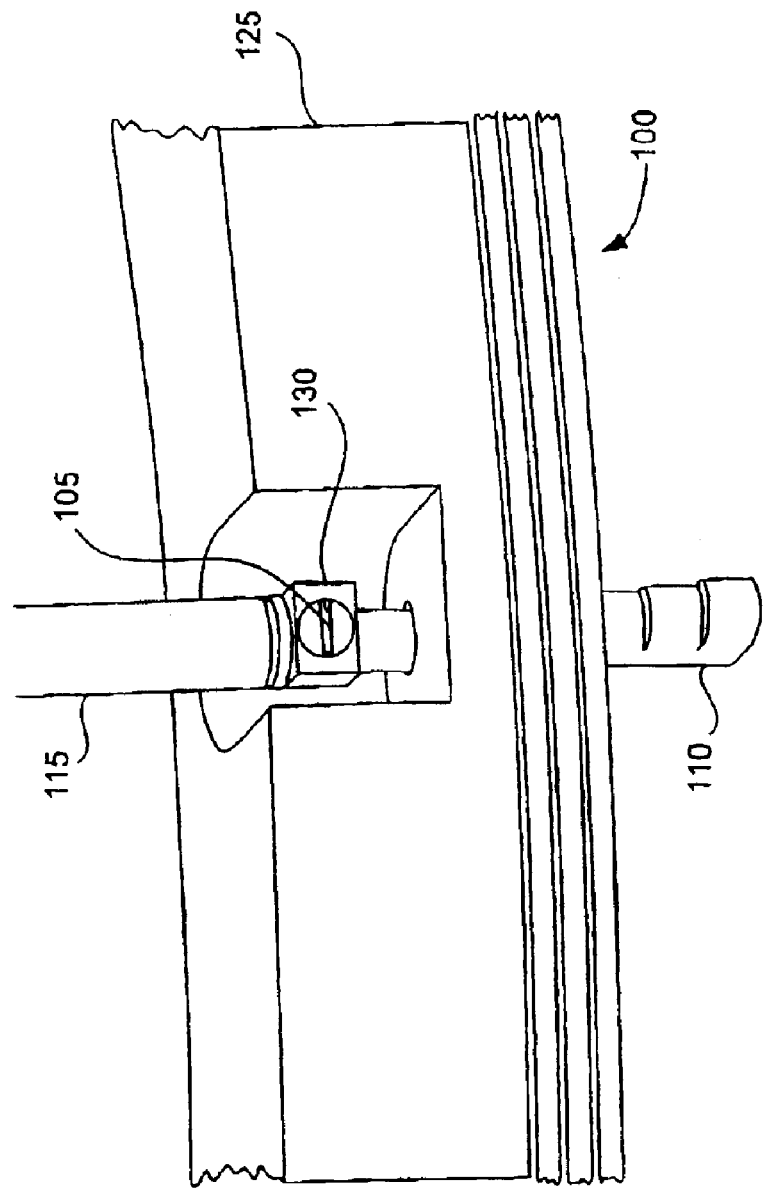
FIG. 1 is a schematic section view of a prior art WAP ring assembly and attachment assembly.
Figure 2:
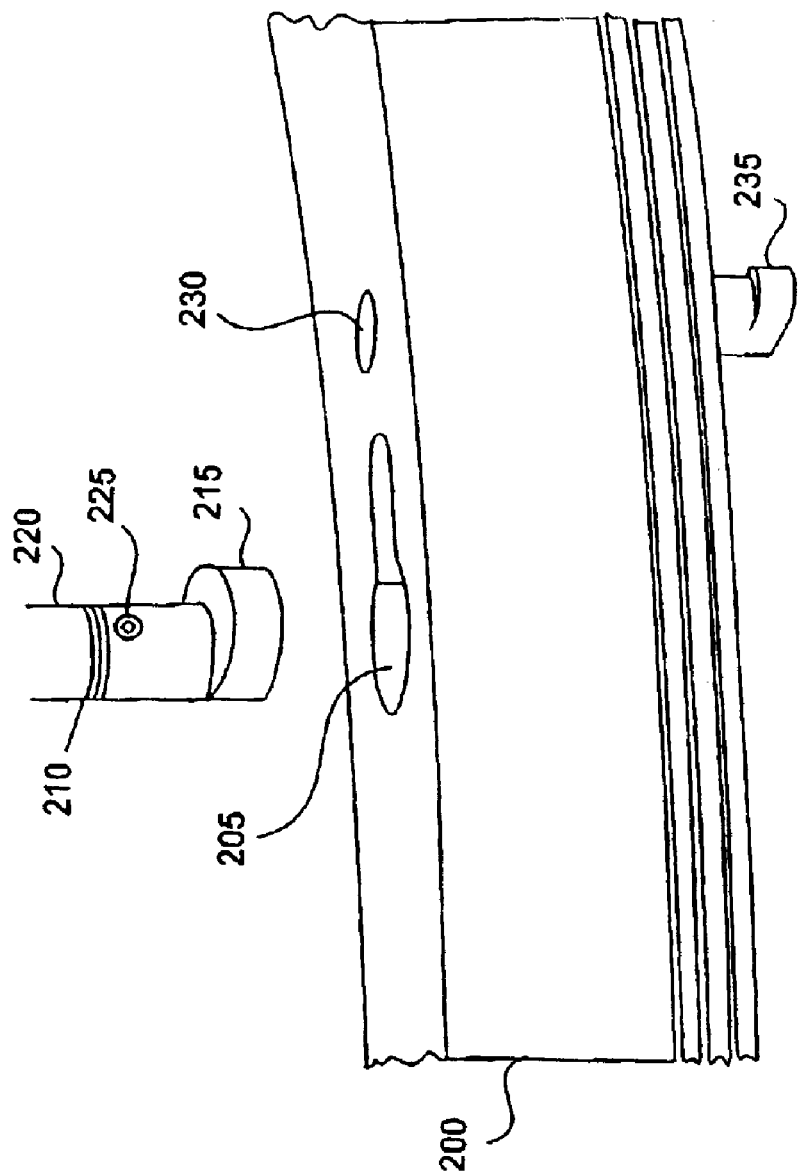
FIG. 2 is a schematic section view of a 300 mm Twist-N-Lock WAP ring and attachment assembly.

To facilitate discussion, FIG. 2 is a schematic view of a Twist-N-Lock WAP ring 200, including the Twist-N-Lock bore 205, and the Twist-N-Lock WAP ring hanger assembly 210, which is composed of the hanger adapter 215 attached to the plunger shaft 220. The hanger adapter 215 is attached via alien bolt 225. Further, the 300 mm Twist-N-Lock WAP ring also contains a hanger hole 230, for attaching the stepped hanger 235.

Figure 3:
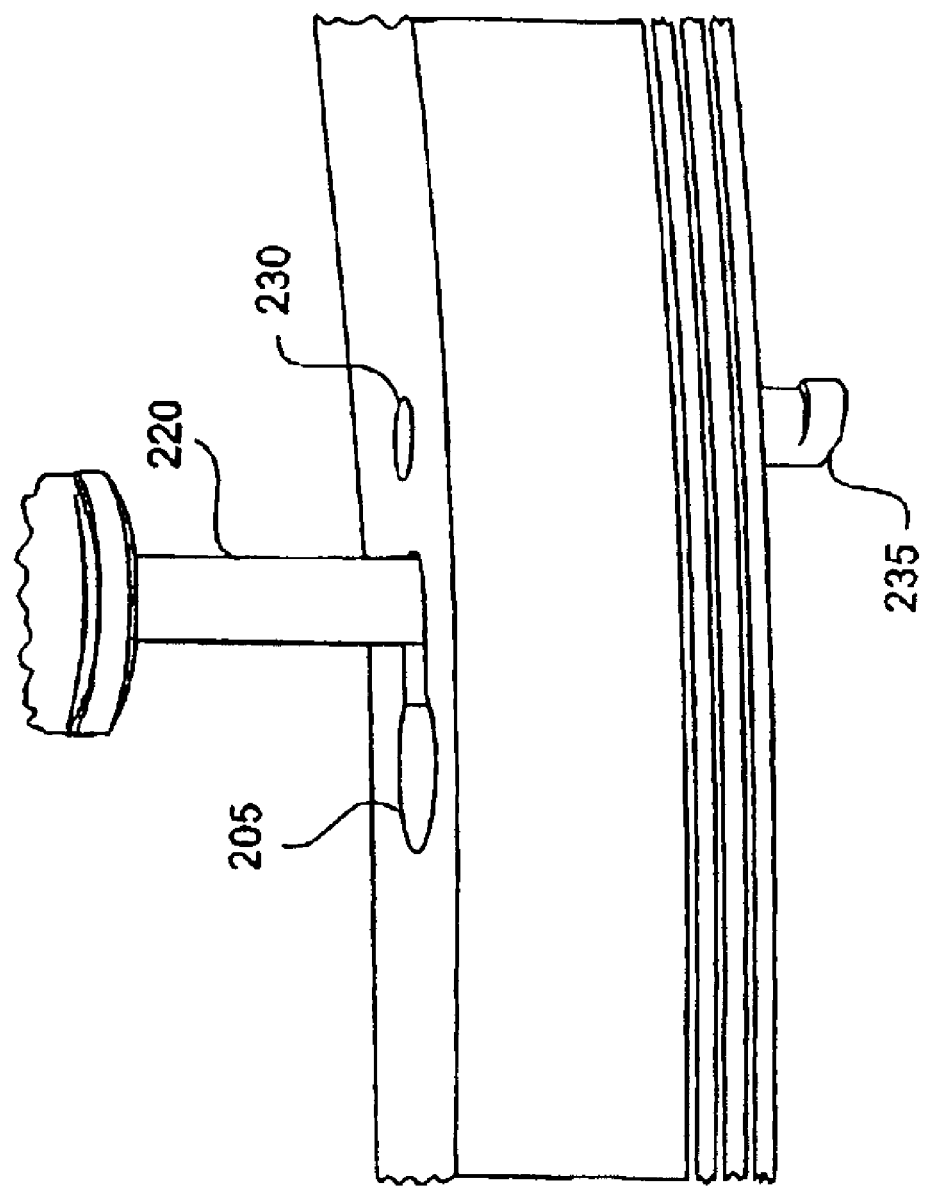
FIG. 3 is a schematic section view of an installed 300 mm Twist-N-Lock WAP ring assembly.
Figure 4B:
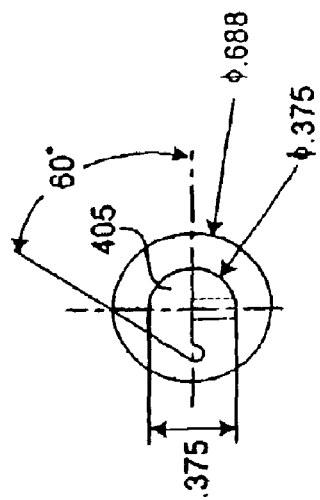
FIG. 4b showing a top-view.
Figure 4A:
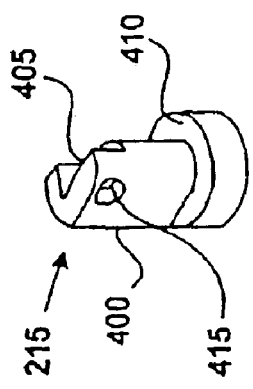
FIG. 4 is a schematic of a WAP Twist-N-Lock hanger adapter with FIG. 4a showing a perspective.
FIG. 4c, showing a side view.
FIG. 4d showing a cross sectional view.
Figure 4D:
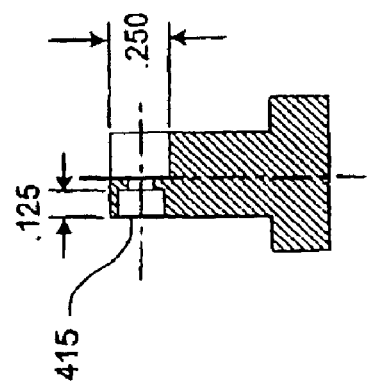
Figure 4C:
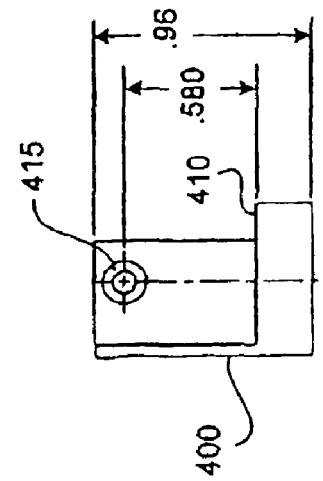

FIG. 3 is a schematic diagram of an installed Twist-N-Lock WAP hanger assembly. Referring back to FIG. 2, to install the Twist-N-Lock WAP ring assembly, the receiving or forward portion of the Twist-N-Lock bore 205 is aligned below the WAP hanger assembly 210. The ring is then lifted into position such that the hanger assembly 210 enters the receiving bore 205 upon which the WAP ring is twisted or turned clockwise approximately 5 degrees clockwise and then slightly dropped to lock the WAP ring into its locked position as shown in FIG. 3.

FIG. 4 shows various perspectives of the Twist-N-Lock hanger adapter 215. Referring to FIG. 4a, the adapter is primarily comprised of the main body portion 400, L notch 405 and the hanging lip 410. The adapter is designed to be installed in conjunction with existing cam plungers for easy retrofit. To this end, the top portion contains the L notch 400 such that it fits snugly with the counter notched bottom portion of the plunger shaft. The L shaped notch prevents "cowbelling" or swinging of the adapter. The hanging lip 410 allows the ring to longitudinally contact the hanger, allowing the ring to hang from the hanger adapter and by extension, the hanger assembly. Attachment hole 415 allows attachment of the hanger adapter to the plunger shaft. Dimensions are given in FIG. 4 and shown in inches.

Figure 7C:
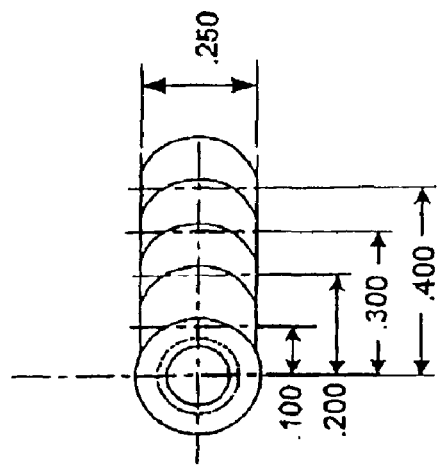
FIG. 7c is a top view of the 300 mm Twist-N-Lock stepped hanger.
Figure 7B:
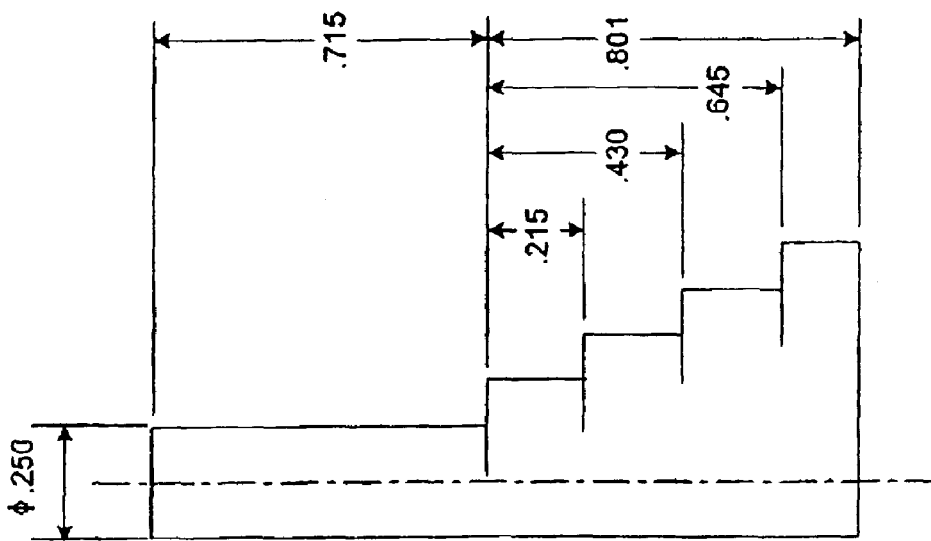
FIG. 7b is a side view schematic of the 300 mm Twist-N-Lock stepped hanger.
Figure 7A:
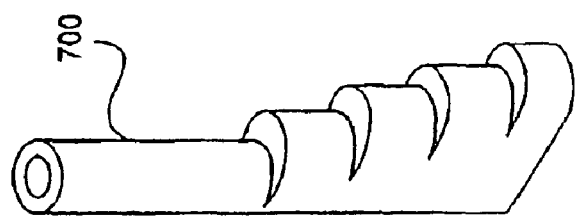
FIG. 7a is a perspective view of the 300 mm Twist-N-Lock stepped hanger.

FIG. 5a is a bottom view schematic diagram of a Twist-N-Lock WAP ring used in conjunction with processing 300 mm wafer substrates. Three Twist-N-Lock bores 205 are machined every 120 degrees. FIG. 6 is a schematic which shows the detail of the Twist-N-Lock bore. The Twist-N-Lock bore 205 is essentially elliptical composed of two circular bores 610 and 615 machined next to one another (the reception bore 610 and the lock bore 615) and set 5 degrees apart 620 on the same radial line 625. The stepped hanger bore 630 allows independent attachment of the stepped hanger shown in FIG. 7. FIG. 7 is a schematic view of a stepped hanger 700.

FIG. 6b shows a cross section of the Twist-N-Lock bore 205 taken through line 3—3 of FIG. 6a. The bottom of the WAP Twist-N-Lock bore is elliptical, the result of machining both the receiving bore 610 and the lock bore 615 completely through the quartz on the underside of the WAP ring. The elliptical bottom of the bore must be of a width minimally as wide as the diameter of the bottom of the hanger adapter 410 (i.e., the bottom lip portion). This allows unfettered passage to the locking bore. The portion of hanging bore which extends through the top of the ring must allow passage of the plunger shaft and hanger adapter assembly to pass to the lock bore during the 5 degree clock-wise twist. This shaft passage minimally must as wide as the shaft portion of the hanger adapter to allow unfettered passage to the locking bore. Unlike the reception bore, the lock bore does not continue through the top of the WAP Twist-N-Lock ring. Instead, it ends, creating a lip, 635 which allows the hanger adapter lip to contact the lock bore lip, creating a secure platform.

FIG. 7 shows several views of the modified stepped hanger attachment. The modified stepped hanger attachment can be attached to the WAP Twist-N-Lock ring through the stepped hanger attachment hole by conventional means, such as a screw. It should be noted that the ring assembly (i.e., the multiple rings) can be step hung together prior to the opening of the chamber. Dimension of the stepped hanger attachment are given in inches in FIG. 7.

Figure 8B:
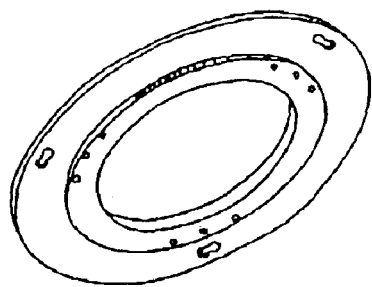
FIG. 8b shows a perspective bottom view of a 200 mm Twist-N-Lock WAP ring.
Figure 8A:
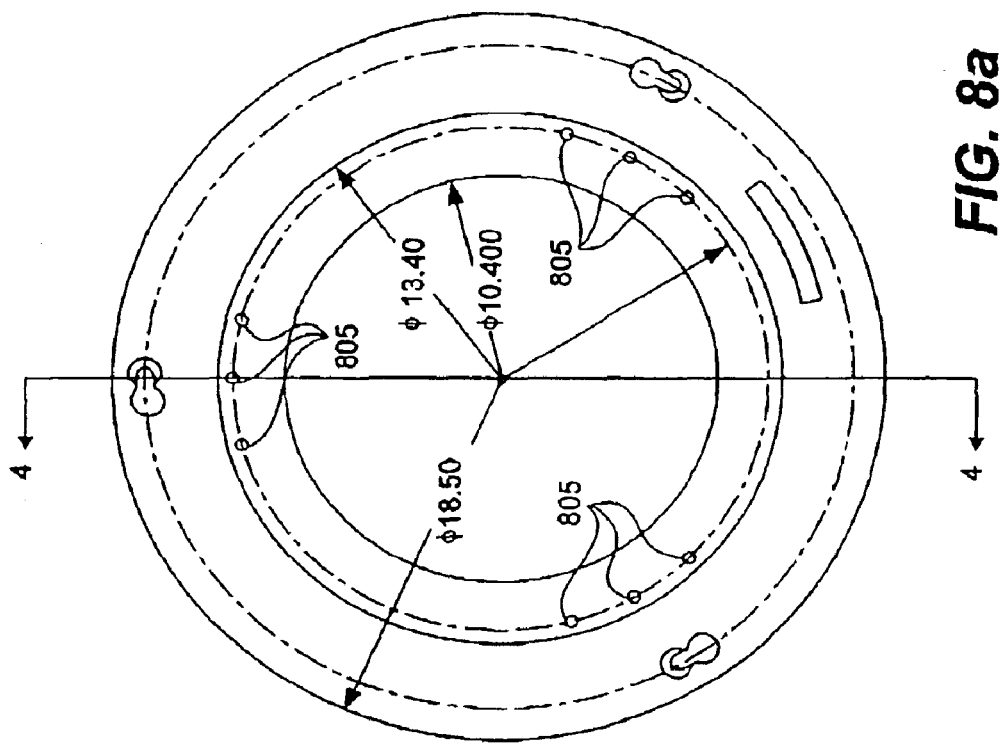
FIG. 8a is a bottom view of a 200 mm Twist-N-Lock WAP ring.
Figure 10C:
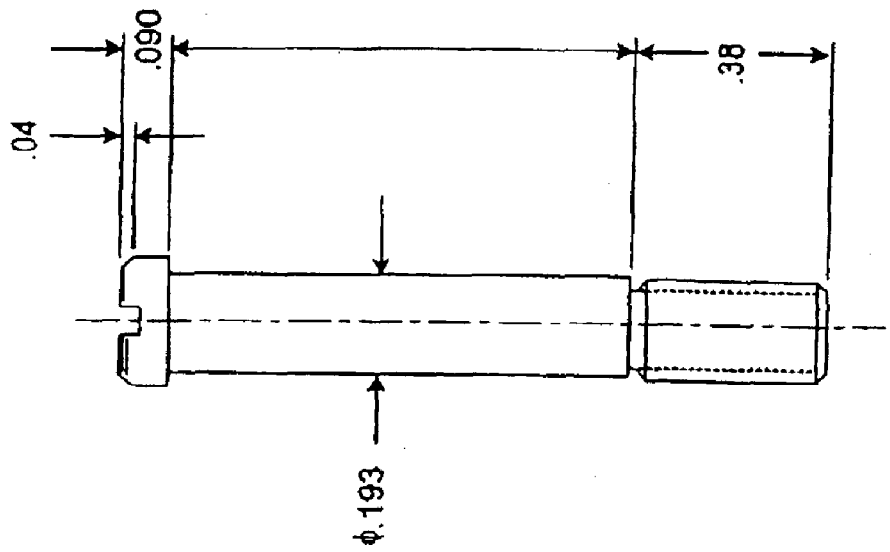
FIG. 10 is a schematic of the 200 mm WAP ring with FIG. 10a showing a perspective schematic, FIG. 10b showing a top view and FIG 10c showing a side view.
Figure 10B:
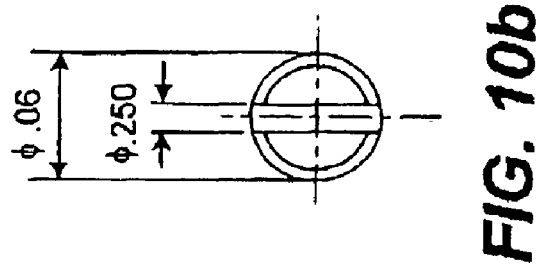
Figure 10A:

FIG. 8a shows a bottom schematic view of the 200 mm Twist-N-Lock ring with relevant dimensions given in inches. The hanging bore configuration is identical to that of the 300 mm ring. However, due to the decreased size (i.e., diameter) of the 200 mm ring, the stepped hanger if left in the same relative position, would strike the electrostatic chuck and not allow rings to collapse or the chamber to be shut properly. Therefore, the stepped hanger must be disposed of and the stepping of the rings handled differently. This is done by machining three sets of step shaft bores 805 in the ring. Placed in the three step shaft bore are three step shafts of different but consistent lengths, i.e, the first set is 0.924 inches long, second set, 1.140 inches long and the third set is 1.354 inches long. FIGS. 9b and 9c show the step shaft holes in greater detail, with FIG. 9c showing a magnified cross section of detail 5 in FIG. 9b. The step shaft bore is comprised of two portions; the shaft bore and the nut bore. FIG. 10 shows a schematic of the step shaft. The primary design consideration of the stepped shaft bore is that the nut bore be of greater diameter than the shaft bore, allowing the step shaft to float loosely from the ring. Ideally the bottom of the nut bore is chamfered to allow seating of the nut.

Figure 11C:
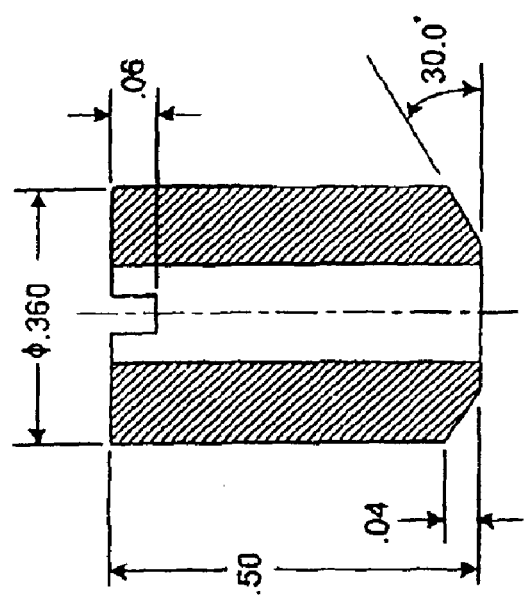
FIG. 11 is a schematic of a WAP ring hanger nut with FIG. 11a showing a perspective schematic, FIG. 11b showing a top view and FIG. 11c showing a side view.
Figure 11B:
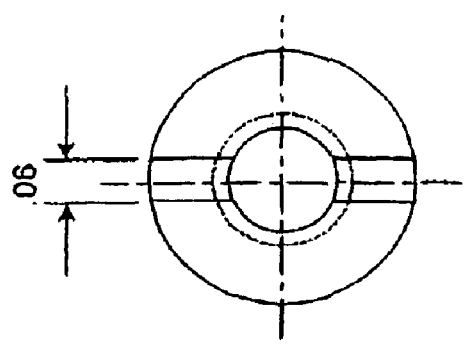
Figure 11A:
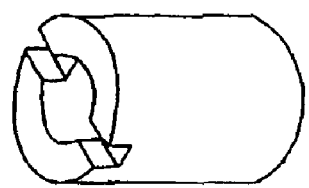
Figure 12:
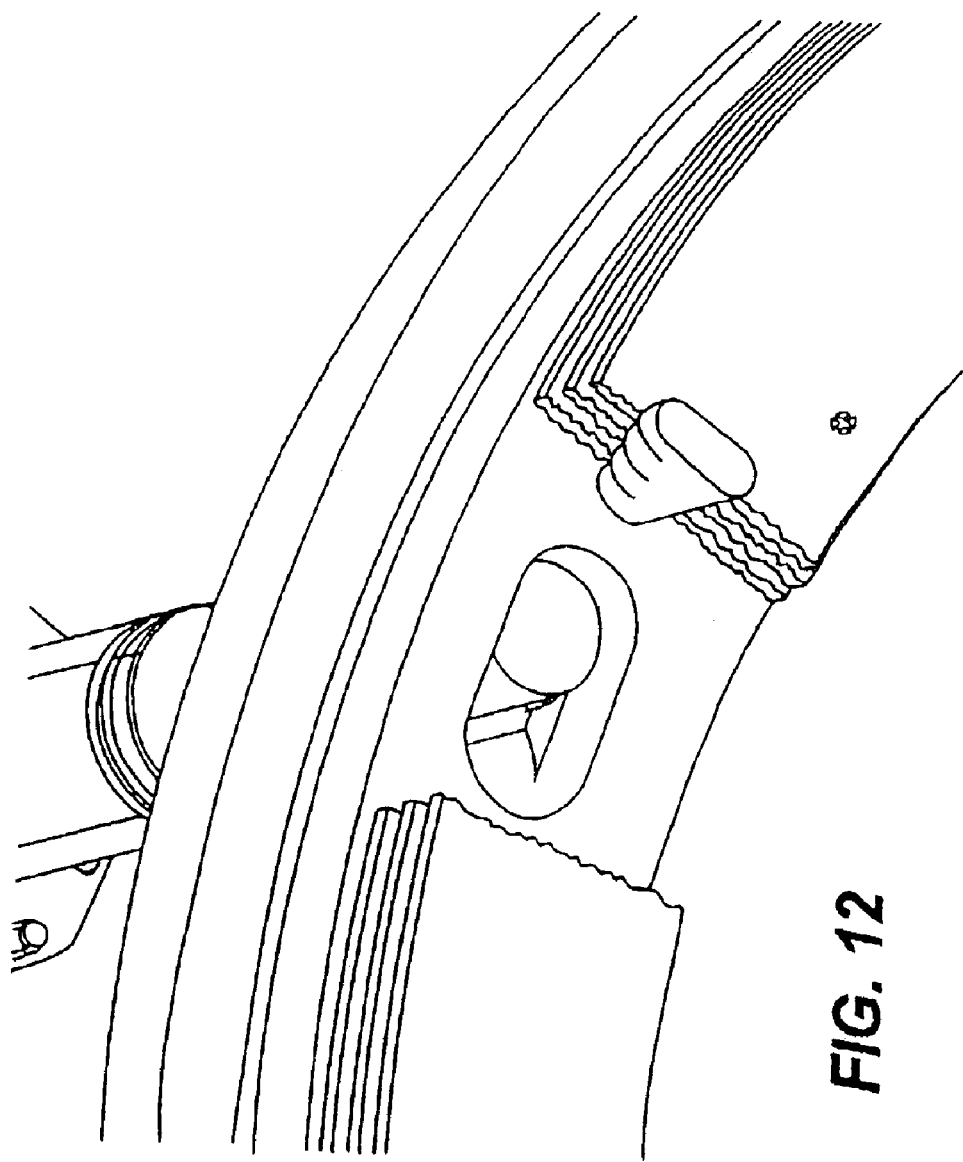
FIG. 12 is a schematic of the installed Twist-N-Lock WAP ring assembly in its locked position viewed from an underside perspective with the 3 lower rings cut-out to expose the assembly.

Referring now to FIG. 10, shown is the schematic of the shaft bore. The distal end is threaded to allow it to be screwed into the nut portion shown in FIG. 11. Three distinct lengths of stepped shafts are required to allow for the difference in floating height of the three WAP rings. Ideally, the nut portion is chamfered to allow for proper seating in the nut bore. Dimensions are given in inches.

For processes that are highly sensitive to particulate contamination, the hanger adapter and the associated Twist-N-Lock bore may be further modified to reduce the potential for introducing particulate contaminants into the plasma processing environment during confinement ring deployment and stowage.

In accordance with one aspect of the present invention, the hanger adapter and Twist-N-Lock bore may be modified to substantially eliminate scraping between the interior sidewall of the lock bore and the periphery sidewall of the locking head of the hanger adapter. Furthermore, modifications may be made to allow the ring assembly, via the top ring, to self-center with respect to the hanger adapter. Since the hanger adapters are attached in a fixed manner to the plungers, which are installed in a spaced-apart relationship from the upper electrode by a predefined distance, the self-centering feature has the effect of ensuring that the ring assembly stay concentrically centered with respect to the upper electrode. As such, the potential for scrapping between the ring assembly and the upper electrode is substantially eliminated, thereby reducing the chance that a significant amount of particulate contaminants would be flaked off into the processing environment during confinement ring deployment and stowage.

Figure 13:
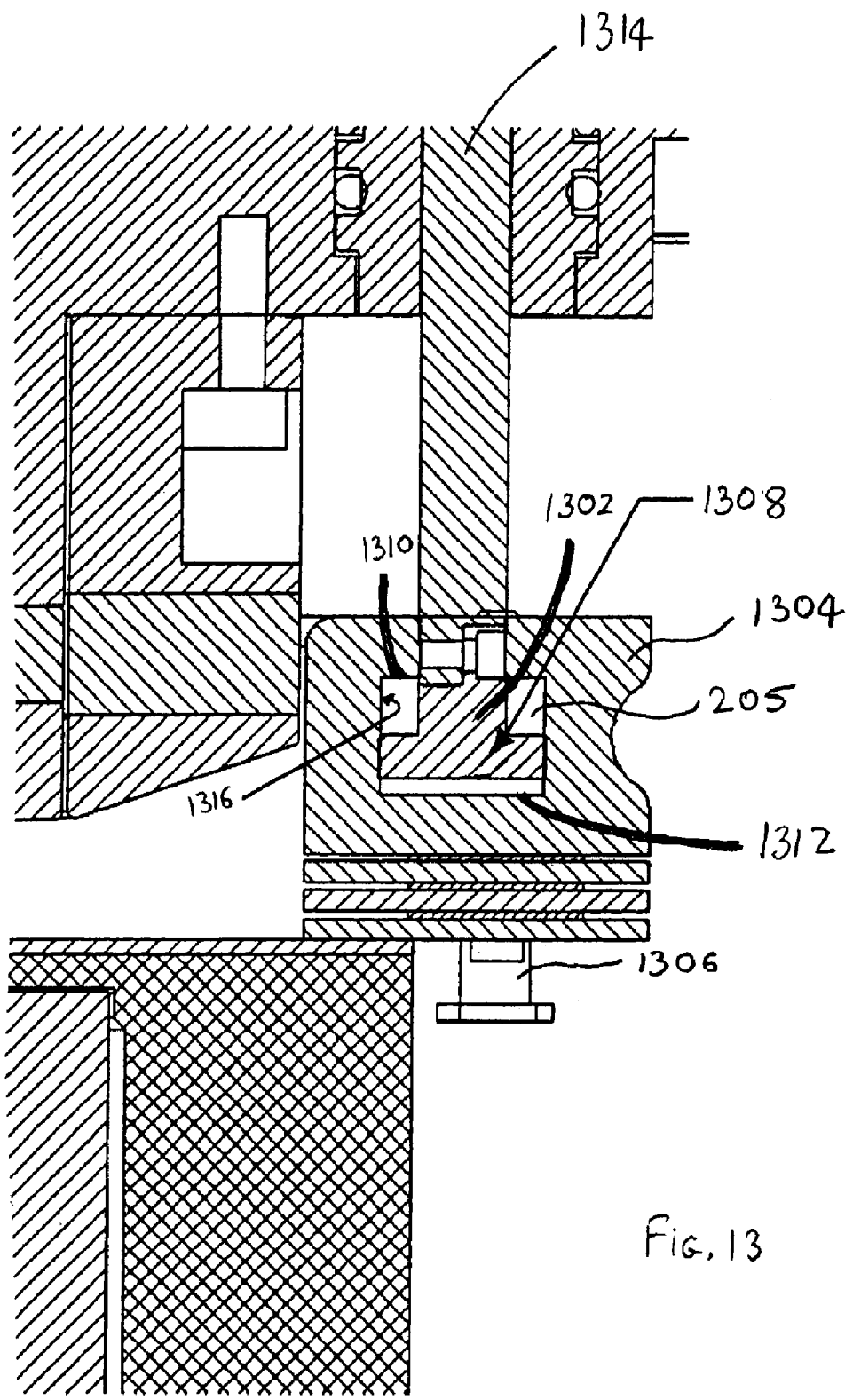
FIG. 13 shows, in accordance with one embodiment of the present invention, a cross-section view of one implementation of the Twist-N-Lock assembly.

To facilitate discussion, FIG. 13 shows the cross-section view of one implementation of the Twist-N-Lock assembly, first without the aforementioned contaminant-reducing feature. In FIG. 13, the ring assembly is shown in the deployed position, wherein the rings of the ring assembly collapse upon one another to form the desired plasma confinement ring arrangement during substrate processing.

In the configuration of FIG. 13, hanger adapter 1302 is disposed within Twist-N-Lock bore 205 of top ring 1304. Top ring 1304 is coupled to the other rings of the ring assembly via a step hanger arrangement 1306, such as one described in connection with FIGS. 7A–7C herein. Alternatively, top ring 1304 may be coupled with other rings of the ring assembly via a confinement ring support assembly such as one described in a commonly assigned, co-pending patent application entitled "Confinement Ring Support Assembly And Methods Therefor," (incorporated by reference herein), U.S. patent application Ser. No. 10/418, 245 filed by the same inventor on even date herewith. Alternatively, top ring 1304 may be coupled with other rings of the ring assembly using another suitable coupling arrangement. The exact coupling arrangement between the rings of the ring assembly is not central to the contaminant-reducing feature to be described hereinbelow.

Due to the nature of the blind keyhole built into Twist-N-Lock bore 205, there is a larger vertical dimension within the lock bore of Twist-N-Lock bore 205 than the thickness dimension of locking head 1308 of hanger adapter 1302 (as evidenced by the gaps above and below locking head 308 within Twist-N-Lock bore 205 in FIG. 13). During the deployment and stowage of the ring assembly, locking head 1308 is thus able to move up and down to some degree within Twist-N-Lock bore 205 as hanger adapter 1302 follows the movement of plunger 1314. The upward movement of locking head 1308 is limited by ceiling 1310 whereas the downward movement of locking head 1308 is limited by floor 1312, as is evident in FIG. 13.

When hanger adapter 1302 moves within Twist-N-Lock bore 205, the sidewall of locking head 1308 may contact sidewall 1316 of Twist-N-Lock bore 205. More specifically, the sidewall of locking head 1308 may scrape against sidewall 1316 of Twist-N-Lock bore 205, causing some of the deposited particles to be flaked off into the processing chamber. The presence of these flakes may contaminate the processing environment during subsequent cycles and/or runs of the processing chamber, causing defects on the substrate.

In accordance with one aspect of the present invention, the diameter of locking head 1308 is reduced to a size substantially smaller than the cross-section of the blind keyhole that engages the locking head. This reduction increases the distance between the sidewall of locking head 1308 and the sidewall 1316 of Twist-N-Lock bore 205. FIG. 14 shows such an implementation wherein sidewall 1402 of locking head 1404 is separated from sidewall 1406 of Twist-N-Lock bore 1408 due to the reduced diameter of locking head 1404. Thus, sidewall 1402 of locking head 1404 no longer scrapes against sidewall 1406 of Twist-N-Lock bore 1408 when hanger adapter 1412 moves up and down within Twist-N-Lock bore 1408. Advantageously, the amount of particulate flakes attributable to such scraping is substantially reduced.

One issue may arise when the diameter of locking head 1404 is reduced. Since there is now a gap between the two sidewalls, the likelihood for the ring assembly to be incorrectly positioned relative to upper electrode 1420 is increased. During the initial assembly process, during maintenance, or during one of the ring assembly deployment/stowage cycles, one or more of the hanger adapter/Twist-N-Lock bore assemblies may be temporarily stuck, pushed, or twisted, causing the ring assembly that comprises rings 1422A, 1422B, 1422C, and 1422D to be offset slightly relative to top electrode 1420. The offset may represent either an angular offset or a lateral offset. When this happens, the electrode-facing sidewalls of ring 1422A, 1422B, 1422C, and/or 1422D may scrape against the ring-facing surface 1426 of the upper electrode 1420 during ring assembly movement.

Figure 15:
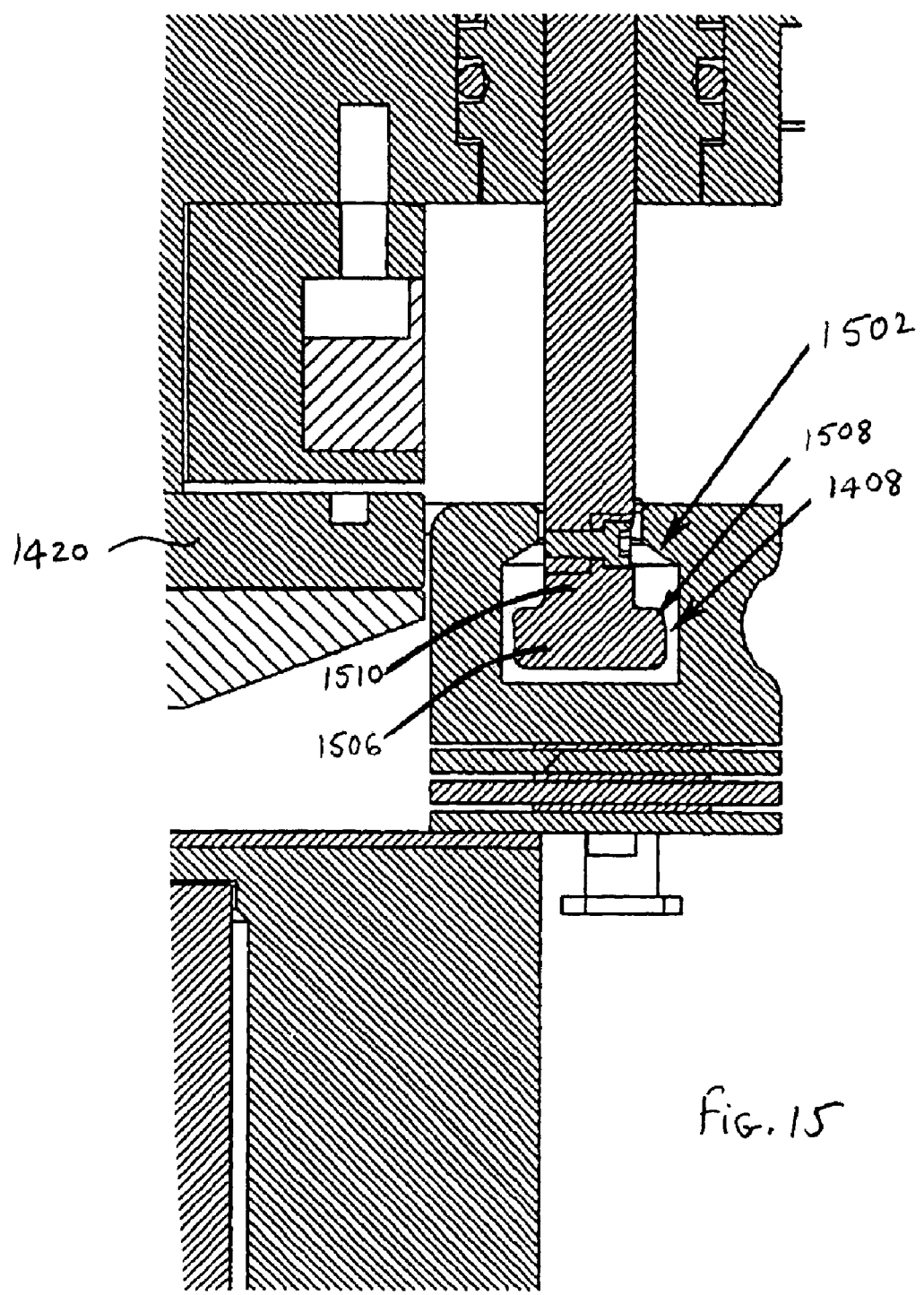
FIG. 15 shows, in accordance with one embodiment of the present invention, the Twist-N-Lock assembly of FIG. 14 in the stowed position.
Figure 16:
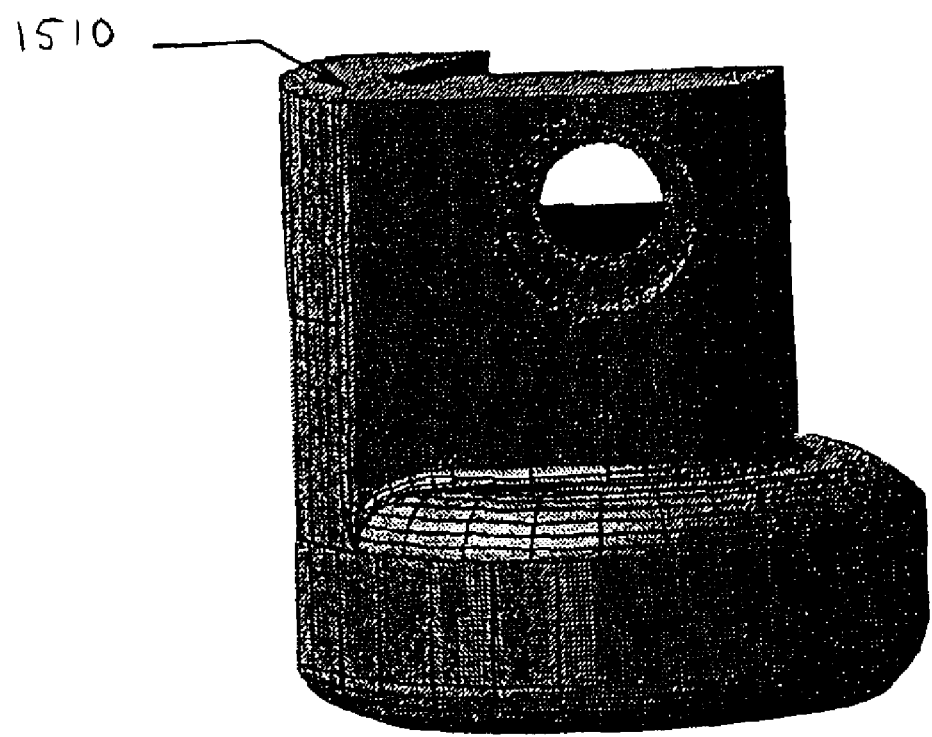
FIG. 16 shows, in accordance with one embodiment of the present invention, a hanger adapter having a radiused shoulder.

In accordance with one aspect of the present invention, the hanger adapter and the Twist-N-Lock bore are modified so as to provide a self-centering action for the ring assembly. FIG. 15 shows, in accordance with one embodiment of the present invention, the modifications that create the self-centering effect. In FIG. 15, the ceiling of Twist-N-Lock bore 1408 is sloped to form a sloped ceiling 1502 that extends approximately from sidewall 1406 toward approximately the plunger opening of Twist-N-Lock bore 1408. Thus, the sloped ceiling of Twist-N-Lock bore 1408 resembles a truncated cone, with the hole that accommodates the hanger adapter or the plunger being disposed at the truncated tip portion of the truncated cone. Additionally, the shoulder 1508 of locking head 1506 of the hanger adapter 1510 is radiused, i.e., the intersection between the sidewall and top edge of locking head 1506 is a curved surface instead of a sharp corner. Radiusing the hanger adapter shoulder has the effect of reducing the friction between the hanger adapter shoulder and the sloped ceiling of the Twist-N-Lock bore.

This radiused shoulder 1508 can then slide along sloped ceiling 1502 in each of the hanger adapter/Twist-N-Lock bore assemblies, thereby allowing gravity to cause each hanger adapter to be centered with respect to the plunger opening of Twist-N-Lock bore 1408 (as seen in FIG. 14), and by extension, to be centered with respect to the plunger. With each Twist-N-Lock bore properly centered with respect to its respective plunger, the focus ring assembly is thus centered with respect to upper electrode 1420.

Note that the amount of radius required of the hanger adapter may vary depending on applications, chamber design, ring design, ring material involved, hanger adapter design and/or hanger adapter material involved. As long as the integrity of the hanger adapter is not compromised during use, the radius may be designed to obtain as low a friction coefficient as possible with the sloped ceiling to ensure aggressive self-centering. Likewise, the angle and length of the slope of the sloped ceiling in the Twist-N-Lock bore may vary depending on similar factors and others. For example, as long as the integrity of the bore is not compromised, the length of the slope may vary and the slope angle of the sloped ceiling may be as steep as desired to ensure an aggressive self-centering action.

The automatic self-centering feature thus helps ensure that substantially no scraping occurs between the electrode-facing sidewalls of rings 1422A, 1422B, 1422C, and/or 1422D and the ring-facing surface 1426 of the upper electrode during ring assembly movement. Advantageously, the amount of particulate flakes attributable to such scraping is also substantially reduced.

While this invention has been described in terms of several preferred embodiments, there are alterations, permutations, and equivalents which fall within the scope of this invention. For example, the invention described herein can be adapted by one skilled in the art to work with any plasma processing systems, including those employed to process 200 mm and 300 mm wafers. It should also be noted that there are many alternative ways of implementing the apparatuses of the present invention. It is therefore intended that the following appended claims be interpreted as including all such alterations, permutations, and equivalents as fall within the true spirit and scope of the present invention.

What is claimed is:

1. In a plasma processing chamber, a confinement ring coupling arrangement for coupling a confinement ring to a plunger, said plunger being configured to move said confinement ring to deploy and stow said confinement ring to facilitate processing of a substrate within said plasma processing chamber, said confinement ring coupling arrangement comprising:

a hanger adapter having a locking head, said hanger adapter being configured to be coupled with said plunger; and a hanging bore disposed in said confinement ring and configured to receive said locking head and to secure said locking head within said hanging bore during stowing and deployment of said confinement ring, wherein a diameter of said locking head is sufficiently smaller than a cross-section dimension of said hanging bore to prevent a sidewall of said locking head from scraping against a sidewall of said hanging bore during said stowing and deployment of said confinement ring.

2. The confinement ring coupling arrangement of claim 1 wherein said hanging bore has a sloped ceiling, said locking head further has a radiused shoulder configured to slidably contact said sloped ceiling during said stowing of said confinement ring to automatically center said locking head with respect to said hanging bore during said stowing of said confinement ring.

3. The confinement ring coupling arrangement of claim 1 wherein said hanging bore has a sloped ceiling, said locking head further has a radiused shoulder configured to slidably contact said sloped ceiling during said stowing of said confinement ring to automatically center said confinement ring with respect to an upper electrode in said plasma processing chamber during said stowing of said confinement ring.

4. The confinement ring coupling arrangement of claim 1 wherein said sloped ceiling has a truncated cone shape.

5. The confinement ring coupling arrangement of claim 1 wherein said hanging bore represents a blind keyhole.

6. The confinement ring coupling arrangement of claim 1 wherein said hanging bore has a sloped ceiling.

7. In a plasma processing chamber, a confinement ring coupling arrangement for coupling a confinement ring to a plurality of plungers, said plurality of plungers being configured to move said confinement ring to deploy and stow said confinement ring to facilitate processing of a substrate within said plasma processing chamber, said confinement ring coupling arrangement comprising:
  a plurality of hanger adapters, each of said plurality of hanger adapters having a locking head, said each of said plurality of hanger adapter being configured to be coupled with said a respective one of said plurality of plungers; and
  a plurality of hanging bores disposed in said confinement ring, each of said plurality of hanging bores being configured to receive one of a plurality of locking heads of said plurality of hanger adapters and to secure said one of said plurality of locking heads within said each of said plurality of hanging bores during stowing and deployment of said confinement ring, wherein a diameter of said each of said plurality of locking heads is sufficiently smaller than a cross-section dimension of a respective hanging bore of said plurality of hanging bores within which said each of said plurality of locking heads is disposed to prevent a sidewall of said respective hanging bore from scraping against a sidewall of said each of said plurality of locking heads during said stowing and deployment of said confinement ring.

8. The confinement ring coupling arrangement of claim 7 wherein said each of said plurality of hanging bores has a sloped ceiling, said each of said plurality of locking heads further has a radiused shoulder configured to slidably contact a respective sloped ceiling of a respective one of said plurality of hanging bores during said stowing of said confinement ring to automatically center said each of said plurality of locking heads with respect to said respective one of said plurality of hanging bores during said stowing of said confinement ring.

9. The confinement ring coupling arrangement of claim 7 wherein said each of said plurality of hanging bores has a sloped ceiling, said each of said plurality of locking heads further has a radiused shoulder configured to slidably contact a respective sloped ceiling of a respective one of said plurality of hanging bores during said stowing of said confinement ring to automatically center said confinement ring with respect to an upper electrode in said plasma processing chamber during said stowing of said confinement ring.

10. The confinement ring coupling arrangement of claim 7 wherein said sloped ceiling has a truncated cone shape.

11. The confinement ring coupling arrangement of claim 7 wherein said each of said plurality of hanging bores represents a blind keyhole.

12. The confinement ring coupling arrangement of claim 7 wherein said each of said plurality of hanging bores has a sloped ceiling.

13. In a plasma processing chamber, a confinement ring coupling arrangement for coupling a confinement ring to a plunger, said plunger being configured to move said confinement ring to deploy and stow said confinement ring to facilitate processing of a substrate within said plasma processing chamber, said confinement ring coupling arrangement comprising:
  a hanger adapter having a locking head, said hanger adapter being configured to be coupled with said plunger; and
  a hanging bore disposed in said confinement ring and configured to receive said locking head and to secure said locking head within said hanging bore during stowing and deployment of said confinement ring, wherein said hanging bore has a sloped ceiling, said locking head further has a radiused shoulder configured to slidably contact said sloped ceiling during said stowing of said confinement ring to automatically center said locking head with respect to said hanging bore during said stowing of said confinement ring.

14. The confinement ring coupling arrangement of claim 13 wherein a diameter of said locking head is sufficiently smaller than a cross-section dimension of said hanging bore to prevent a sidewall of said locking head from scraping against a sidewall of said hanging bore during at least one of said stowing and deployment of said confinement ring.

15. The confinement ring coupling arrangement of claim 14 wherein confinement ring is coupled to at least one other confinement ring in said plasma processing chamber.

16. The confinement ring coupling arrangement of claim 13 wherein said hanging bore represents a blind keyhole.

17. The confinement ring coupling arrangement of claim 13 wherein said hanging bore has a sloped ceiling.

* * * * *